United States Patent [19]
Yusong et al.

[11] Patent Number: 5,936,983
[45] Date of Patent: Aug. 10, 1999

[54] THIRD HARMONIC GENERATION APPARATUS

[75] Inventors: Yin Yusong, Stony Brook; Dmitry Donskoy, Oceanside, both of N.Y.

[73] Assignee: Photonics Industries International, Inc., Stony Brook, N.Y.

[21] Appl. No.: 08/987,891

[22] Filed: Dec. 10, 1997

Related U.S. Application Data

[63] Continuation-in-part of application No. 08/788,772, Jan. 24, 1997.

[51] Int. Cl.[6] .................................................. H01S 3/10

[52] U.S. Cl. ........................................................ 372/22

[58] Field of Search ............................. 372/22; 359/328

[56] References Cited

U.S. PATENT DOCUMENTS

| | | | |
|---|---|---|---|
| 4,866,720 | 9/1989 | Holly | 372/22 |
| 5,206,868 | 4/1993 | Deacon | 372/22 |
| 5,638,388 | 6/1997 | Nigham et al. | 372/22 |

*Primary Examiner*—Rodney Bovernick
*Assistant Examiner*—Robert E. Wise
*Attorney, Agent, or Firm*—James A. Quinton, Esq.

[57] ABSTRACT

Third harmonic generated from intra-cavity frequency tripled resonator is disclosed in which a type I or type II phase matching crystal is used as the tripler. Type I phase matching is used for second harmonic generation. The resonator efficiently converts the fundamental laser frequency to its third harmonic laser beam. The laser is highly efficient with high third harmonic output stability. Overall conversion efficiency exceeds 25% and preferably is 50% or higher.

12 Claims, 5 Drawing Sheets

THIRD HARMONIC GENERATION APPARATUS

This application is a continuation in part of Ser. No. 08/788,772 filed Jan. 24, 1997

BACKGROUND OF THE INVENTION

1. Field of the Invention

The field of the invention concerns a frequency tripled laser, and in particular a method and apparatus for generating a frequency tripled beam.

2. Background of the Invention

Optical harmonic generation using a non-linear medium such as a crystal, provides a method for doubling, tripling or more generally producing the Nth harmonic of the frequency of electromagnetic radiation emitted by a laser or other high intensity source. The third harmonic is produced by sum frequency generation of the laser fundamental and its second harmonic beams through second order nonlinearities of the nonlinear medium ($P(\omega) = \eta_0(3) * P_o(\omega) * P_o(2\omega)$). The common third harmonic generation method, which is known in the art, combines the fundamental and the second harmonic beam in a nonlinear crystal to generate its third harmonic in the external laser cavity. For a high power laser, typical efficiency is limited to less than 25% overall conversion efficiency, since unconverted fundamental beam and second harmonic beam are wasted in that configuration. The overall conversion efficiency $\eta = P(3\omega)/P_0(\omega) = \eta_0(3\omega) * \eta_1(2\omega) P_0^2(\omega) - \eta_1(2\omega) P_0^2(\omega))$ is less than 25% for even very high power pulsed Nd:YAG lasers (see Continuum Products brochures).

The theory of intra-cavity second harmonic generation (SHG) has been discussed by R. G. Smith, *I.E.E.E. Journal of Quantrum Electr.* QE-6, 215–223 (1970). Franken and Ward, in *Rev. Mod. Phys.* 35 23 (1963) has noted that a crystalline medium can produce a second harmonic of the frequency of the incident radiation only if the crystal lacks inversion symmetry so that the second order polarization tensor $d^{ij}$ in the lowest order non-linear polarization term does not vanish. If the crystal has inversion symmetry, the lowest order non-linear polarization contribution is cubic in the electric field strengths, and this crystal will produce only third or higher harmonics of the initial frequency. Beam or parametric production of harmonics has been demonstrated in crystals such as $LiNbO_3$, $BaNa(NbO_3)$; $LiO_3$, KDP, $KTiOPO_4$, BBO and $LiB_3O_5$. $LiB_3O_5$ is also referred to as LBO crystal.

SUMMARY OF THE INVENTION

According to the invention a third harmonic frequency generating method and apparatus is provided. The system includes within the optical cavity an active laser medium, a second harmonic generator for generating second harmonic frequency of the fundamental frequency emitted by the laser, a third harmonic generator for generating third harmonic frequency of the fundamental frequency, and a wavelength selective coupling to facilitate the removal of the third harmonic from the optical cavity. Optionally the unconverted second harmonic beam can be directed through the laser medium as additional pumping. The resulting laser has a conversion efficiency of 25% or greater and preferable 50% or more.

Third harmonic output of Nd:YAG or Nd:YLF is desirable in some applications such as in small hole drilling on multilayers circuit board. The third harmonic wavelength is one third of its fundamental wavelength. The focus ability is proportional to the wavelength. What this means is the shorter the wavelength, the smaller the spot size. In addition to its better focus ability, the higher photon energy of the third harmonic tends to have better interaction in material processing applications.

Useful in this invention are a type I phase matching crystal for second harmonic generation and both type I and type II phase matching crystal for third harmonic generation. In a type I phase matching crystal for second harmonic generation, the fundamental beam is polarized perpendicular to the crystals axis (an O or ordinary ray) and the generated second harmonic beam is polarized parallel to the optic axis (an E or extraordinary beam). In a type I phase matching crystal for third harmonic generation, the fundamental beam and second harmonic beam incident on the type I crystal in parallel polarization to one another and produce a third harmonic beam with perpendicular polarization to the first and second harmonic beams. In a type II phase matching crystal for third harmonic generation, the fundamental beam and second harmonic beam are orthogonal polarized and produce a third harmonic beam with its polarization parallel to the polarization of one of two input: beams (for example in a type II LBO crystal the polarization of the fundamental beam and the third harmonic beam will be parallel).

It is an object of the invention to provide efficient intracavity generation of optical third harmonic frequencies of light or radiation, using a nonlinear crystal or crystals or other conversion means positioned within the optical cavity containing the active laser medium.

It is an object of the invention to provide laser frequency tripling apparatus by using type I or type II nonlinear crystal within the laser cavity.

It is an object of the invention to provide frequency tripling apparatus with overall conversion efficiency of 25% or more (tripled output power/total fundamental output power).

It is an object of the invention to provide high output of tripled frequency beam in ultraviolet.

It is an object of the invention to increase third harmonic conversion efficiency by redirecting second harmonic frequency beam to pump the laser medium.

Other and further objects will become apparent from the specification, drawings and claims.

The preferred embodiment of the present invention is illustrated in the drawings and examples. However, it should be expressly, understood that the present invention should not be limited solely to the illustrative embodiment.

DETAILED DESCRIPTION OF THE INVENTION

According to the invention, a frequency tripled laser is provided which includes a first and second mirror which form an optical resonator cavity. An efficient intra-cavity third harmonic frequency generating laser is provided with a conversion efficiency of 25 to 50 percent preferably 50% or greater. A laser medium preferably a solid state laser medium is located within the optical cavity to generate a fundamental beam of electromagnetic radiation having a preselected wavelength propagating from the front and back end of the laser medium. A second harmonic generator located within the optical cavity is provided for converting a portion of the fundamental beam to a second harmonic wave length beam. Preferably the second harmonic generator includes a type I frequency doubling nonlinear crystal. A type I or II frequency tripling nonlinear crystal is also located within the laser cavity. The fundamental wave length beam from the laser is directed through the type I frequency doubling crystal within the optical cavity. As a result a portion of the fundamental beam is converted to second harmonic wave length. The fundamental and second harmonic beams are reflected back through the type I crystal optionally in phase where the first harmonic beam is again partially converted to second harmonic. The resulting fundamental beam and second harmonic beam are then directed to a type II frequency tripling nonlinear crystal or optionally through a type I frequency tripling crystal which converts a portion of the fundamental beam and a substantial portion of the second harmonic to a third harmonic frequency when both fundamental and second harmonic beams propagate through the frequency tripling crystal. The resulting beams which are the fundamental, second harmonic and third harmonic are then directed to a third harmonic separator in which the third harmonic beam is separated from the fundamental beam and directed outside the optical cavity as the output of the laser. The fundamental beam is then directed back through the laser medium and is amplified. Preferably both the fundamental and the unconverted second harmonic beams are directed back through the laser medium to increase its efficiency. A mirror is provided at the back end of the laser medium to reflect back to the laser medium energy exiting the back of the laser medium.

Figure 1:
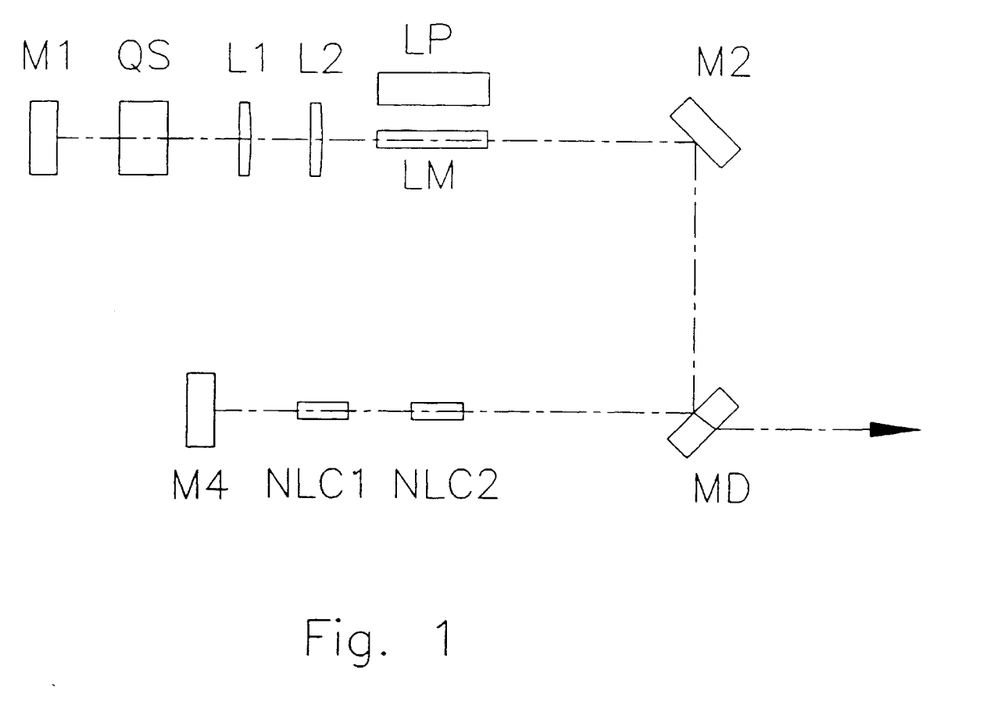
FIG. 1 is a diagrammatic view of a laser according to the invention.

Referring now to FIG. 1, a frequency tripled laser is provided. A lasing material LM is provided. A number of different lasing mediums can be used for example Nd:YLF, Nd:YAG, Nd::YVO$_4$. A laser pump LP for example a lamp, laser diodes or another laser is provided to energize the lasing medium. Mirrors M1 and M4 are provided to define the optical cavity. Optionally between mirror M1 and lasing material LM, a Q switch can be provided in the event a pulsed laser output is desired instead of a continuous wave output. Optionally, spherical lens L2 and cylindrical lens L1 are provided particularly with an Nd:YLF crystal. The spherical lens adjust the spot size of the beam. The cylindrical lens compensates for thermal lensing characteristics of the crystal particularly of an Nd: YLF crystal. In the Q switch option, the laser is held off by introducing a loss into the resonator cavity while energy is pumped into and stored in the atomic population inversion. Once desired inversion is attained, cavity losses are reduced to allow lasing. In this mode, it is possible to produce large pulse chain output from the laser. Mirror M1 is a high reflector mirror for the fundamental frequency of the lasing medium LM. The laser medium is selected to generate a laser beam at a preselected fundamental frequency along a common axis 1. Preferable as shown in FIG. 1 the optical axis is generally u-shaped. A beam propagates from both the front of the laser medium and from the back of the laser medium towards Mirror M1. For example an Nd:YLF laser medium can be used which emits a beam having a wave length of 1053 nm. According to the invention, a second harmonic beam having a wave length of 527 nm and third harmonic beam in the UV spectrum having a wave length of 351 nm will be produced.

A mirror M2 which is a high a reflector for the fundamental frequency of the laser medium EM and optionally a high reflector for the second harmonic frequency is provided in optical communication with output from the front end of the lasing medium, LM. Desirable mirror M2 is a folding mirror. A mirror MD is provided in optical communication with M2. MD is a high reflector for beams having the preselected fundamental frequency and high transmission for third harmonic frequency beam. Desirably MD is a dichroic mirror. Optionally MD is also a high reflector for second harmonic wave length beams. Preferably a type II nonlinear crystal for third harmonic generation NLC2 preferably a type II lithium triborate crystal (LBO) is provided in optical communication with beams reflected by mirror MD. The output of NLC2 is directed to a type I nonlinear crystal NLC1 for second harmonic generation preferably a type I LBO crystal. The output of NLC1 is directed to mirror M4 which is a high reflector for both fundamental frequency and second harmonic frequency beams.

The fundamental beam from the laser medium LM is reflected by M1 and amplified by LM along the fundamental optical axis "1". The beam then incidents on mirror M2. M2 preferably reflects vertical polarized fundamental beam to Mirror MD and transmits horizontal polarized fundamental beam. As a result vertical polarized beams are favored and horizontal polarized beams are discouraged. Thus laser material LM lases at vertical polarization. Optionally M2 can reflect horizontally polarized fundamental beam and transmit vertically polarized fundamental beam. The laser material will then laser at horizontal polarization. Mirror MD directs the reflected beam from Mirror M2 to Crystal NCL2. The fundamental beam 1 passes NLC2 and incidents on NLC1. Since type II crystal NLC2 only converts a fundamental beam to a third harmonic beam in the presence of the second harmonic beam, the fundamental beam is unaffected on this pass through NLC2. A small portion of the fundamental beam (beam 1) converts to the horizontal polarized second harmonic beam (beam 2) through NLC1 by meeting its phase matching condition (K(2w)=K(w)+K(w) either through critical phase matching (orientation of the crystal) or noncritical phase matching (temperature tuning). Both beam 1 and beam 2 propagate toward the mirror M4 and are reflected back from the same mirror. When the beam 1 passes through the NLC1 on reflection from the Mirror M4, another small portion of the fundamental beam converts to its second harmonic beam which is superimposed with the reflected second harmonic beam 2 to form a combined second harmonic beam 2. The crystal NLC2 converts a portion of fundamental beam 1 and a substantial portion of second harmonic beam 2 propagating from NLC1 into the third harmonic beam (beam 3) under the satisfaction of phase matching condition k(3w)=½(K(w)+k(2w)). The beams 1, 2, 3 are directed to Mirror MD. Preferably MD removes third harmonic beam from the cavity, and reflects beam 1 and preferably beam 2 toward Mirror M2. Optionally, both beam 2 and 3 that is the second harmonic and third harmonic can be removed together from the cavity. The fundamental beam 1 reflected back from Mirror M2 is amplified by the laser Medium LM. Mirror M2 is preferably reflective for second harmonic wave length beam. This beam 2 is reflected back from M2 and pumps LM to increase pumping efficiency. The beam spot size on the crystal NLC1 and NLC2 is desirably one half or less than the diameter of the crystal.

The resulting laser has an improved efficiency. An overall conversion of fundamental to third harmonic of over 25% is achieved. Preferably an efficiency of from about 25% to about 50% is achieved and most preferably a conversion efficiency of over about 50% is achieved. The overall conversion efficiency is calculated by dividing the tripled frequency output power by total fundamental frequency output power under the condition of no second harmonic frequency and third harmonic frequency generations. For example typically a prior art Nd:YLF laser produces total 12 watts power at the fundamental frequency at Q-switched 1000 Hz repetition rate at 150 nanosecond pulse width. With the same laser, a total 2 watts or less watts of tripled frequency power is generated from the laser. The overall conversion efficiency is less than 17%. According to the intention, a laser Nd:YLF as shown in FIG. 1 produces 6.8 watts frequency tripled output in ultraviolet wavelength from a 12 watts fundamental frequency power at 1000 Hz repetition rate. The conversion efficiency is about 57%.

Figure 2:
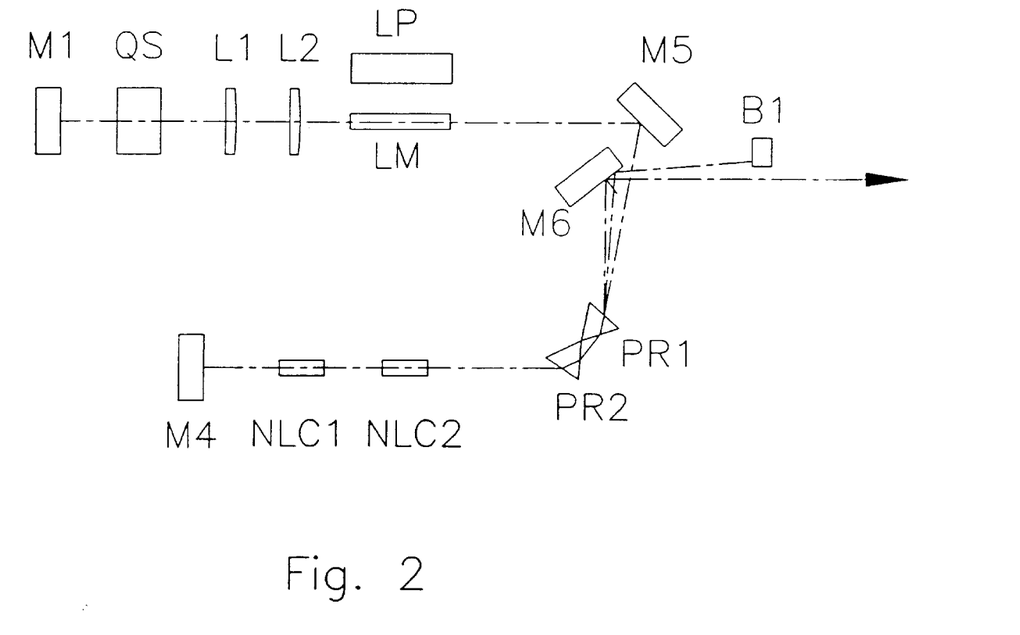
FIG. 2 is a diagrammatic view of an alternative embodiment of the laser according to the invention.

Referring to FIG. 2, an alternative embodiment of a laser according to the invention in which a pair of prisms PR1 and PR2 preferably UV graded fused silica prisms are used to separate the third harmonic beam from the fundamental beam is shown. The fundamental beam from laser medium LM is directed to Mirror M5 which is a high reflector for fundamental beam. The fundamental beam is reflected to Prism PR1 and PR2 which deflects the fundamental beam and directs it to NLC2. The beam passes through NLC2, NLC1 and is reflected by Mirror M4 as described regarding to FIG. 1. The fundamental, second and third harmonic beams then enter prism PR2 where the beams are displaced from one to another. The displaced beams enter prism PR1 which increases the displacement between the beams. The fundamental beam leaving PR1 is directed to mirror M5 and reflected back to LM. The second and third harmonic beams are directed to Mirror M6 which is reflective for third harmonic and second harmonic beam and reflects the beams outside the laser cavity. Preferably a second harmonic beam block B1 is provided to block the second harmonic beam from the output.

Figure 3:
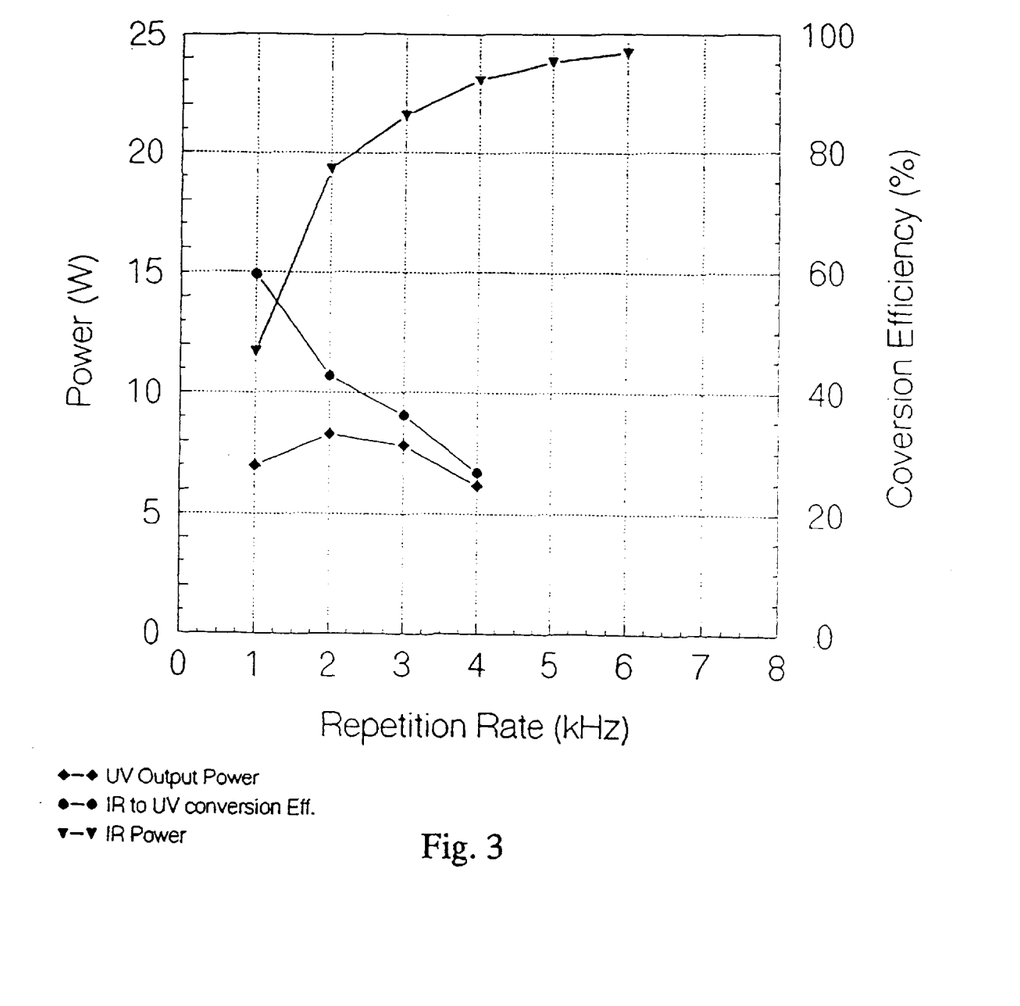
FIG. 3 is a graph of third harmonic conversion efficiency according to the invention.

FIG. 3 shows graphical representation of the benefits of the invention. In FIG. 3, IR output power is plotted against pulse repetition rate. UV output power is plotted against pulse repetition rate for lasers according to the invention. Infrared conversion efficiency is plotted against pulse repetition rate according to the invention. It can be seen from FIG. 3 that a conversion efficiency of from over 25% to 50% or greater can be obtained according to the invention.

Figure 4:
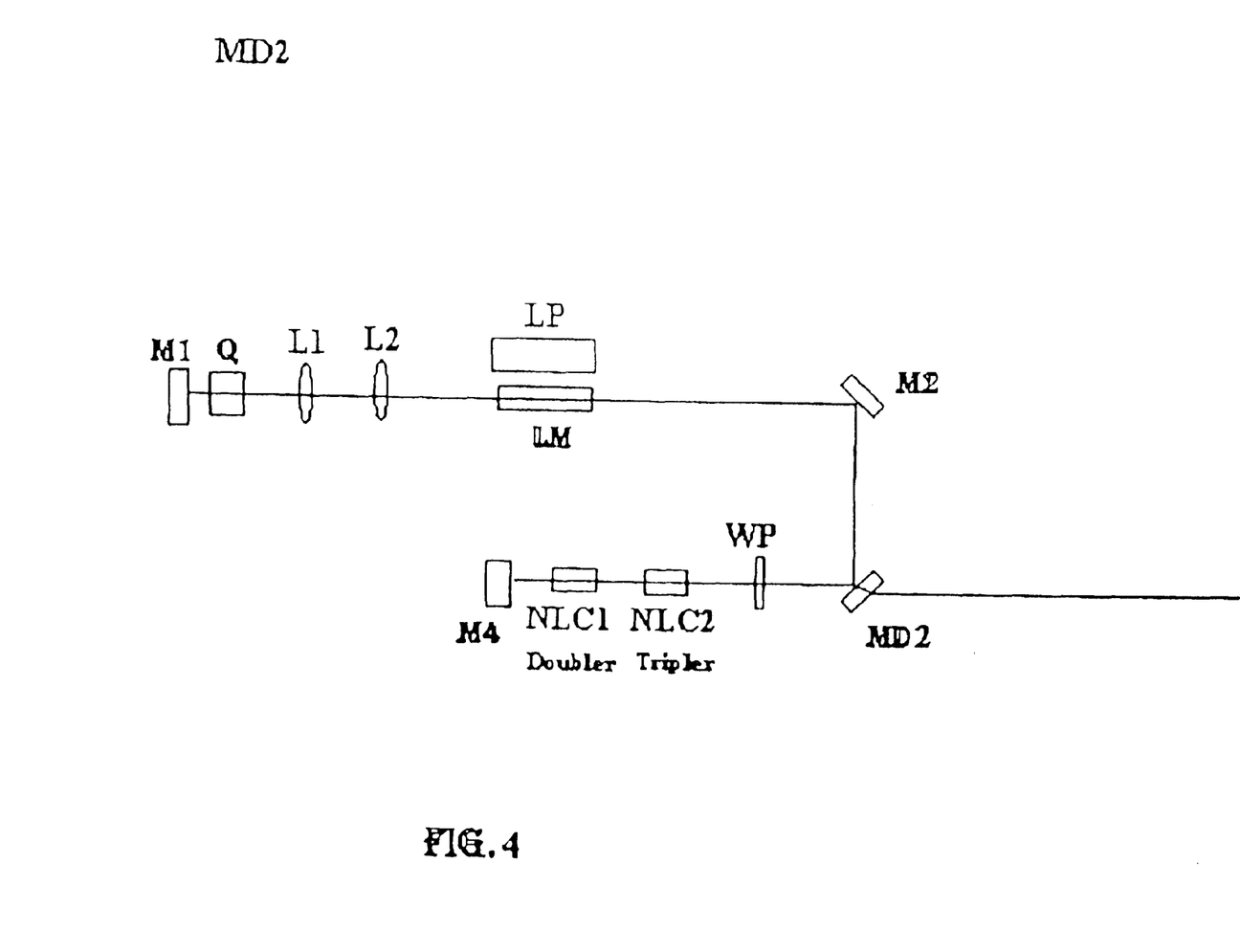
FIG. 4 is a diagrammatic view of an alternative embodiment of the laser according to the invention.

In another aspect of the invention, it has been found that an improved recovery of the third harmonic beam from the laser cavity can be obtained if the polarization of the third harmonic beam with the mirror MD is "P" polarization. Removal of over about 90% preferably about 95% to 99% more preferably about 99% of the third harmonic is achieved. The third harmonic beam is the output of the laser. FIG. 4 is similar to FIG. 1 except a wave plate WP is provided between type II non-linear crystal NLC2 and beam separation mirror MD. In FIG. 4, mirror MD2 preferably a dichroic mirror is coated for high transmission for third harmonic frequency beam incidencing on mirror MED2 at a P polarization to MD and reflective for fundamental frequency beams. Preferably, mirror MD2 is a dielectric coated dichroic mirror which reflects better than 99.5% at the fundamental wavelength and transmits better than 95% at the third harmonic beam, when the third harmonic beam incidents on the mirror at P-Polarization to the mirror. Such mirrors are available from CVI 200 Dorado Place SE, Albuquerque, N. Mex. 87192 and Spectrum Thin Film, 100-E Knickerbocker Avenue, Bohemia, N.Y. 11716. For the orientation of mirror MD2 shown in FIG. 4, horizontally polarized third harmonic beam incidents on mirror MD2 with P polarization.

In the device of FIG. 4, the fundamental beam is reflected by M2 at a vertical polarization. The fundamental beam is then reflected by MD2 and passes through waveplate WP. Waveplate WP rotates the fundamental beam a full wave or an integer of a full wave. As a result the polarization of the fundamental beam is unchanged. The fundamental beam then passes through NLC2 where it is unaffected in the absence of a second harmonic beam. The fundamental beam then incidents on NLC1 where a portion of the fundamental beam is converted to second harmonic. The polarization of the fundamental beam remains vertically polarized while the resulting second harmonic beam is horizontally polarized. The fundamental and second harmonic are reflected by M4 back through NLC1. There again a portion of the fundamental beam is converted to horizontally polarized second harmonic. The fundamental and second harmonic are then directed across NLC2 which requires a fundamental and a second harmonic beam incidents across the crystal in orthogonal polarization to one another. A portion of the fundamental and a major portion of the second harmonic are converted to a third harmonic beam having the same polarization as the fundamental, in this instance vertical polarization. The beams leaving NLC2 then are directed through waveplate WP which performs a ½ wave rotation on the third harmonic beam to convert its polarization to horizontal polarization prior to its incidents on mirror MD2. MD2 will remove substantially all the third harmonic beam from the laser cavity.

Alternatively, the embodiment of FIG. 4 can be further modified. A waveplate can be placed between NLC2 and MD2 which rotates half wave for fundamental wavelength and full wave for third harmonic beam. Other combinations can be provided to achieve "P" polarization when the third harmonic beam incidents on the MD2.

Figure 5:
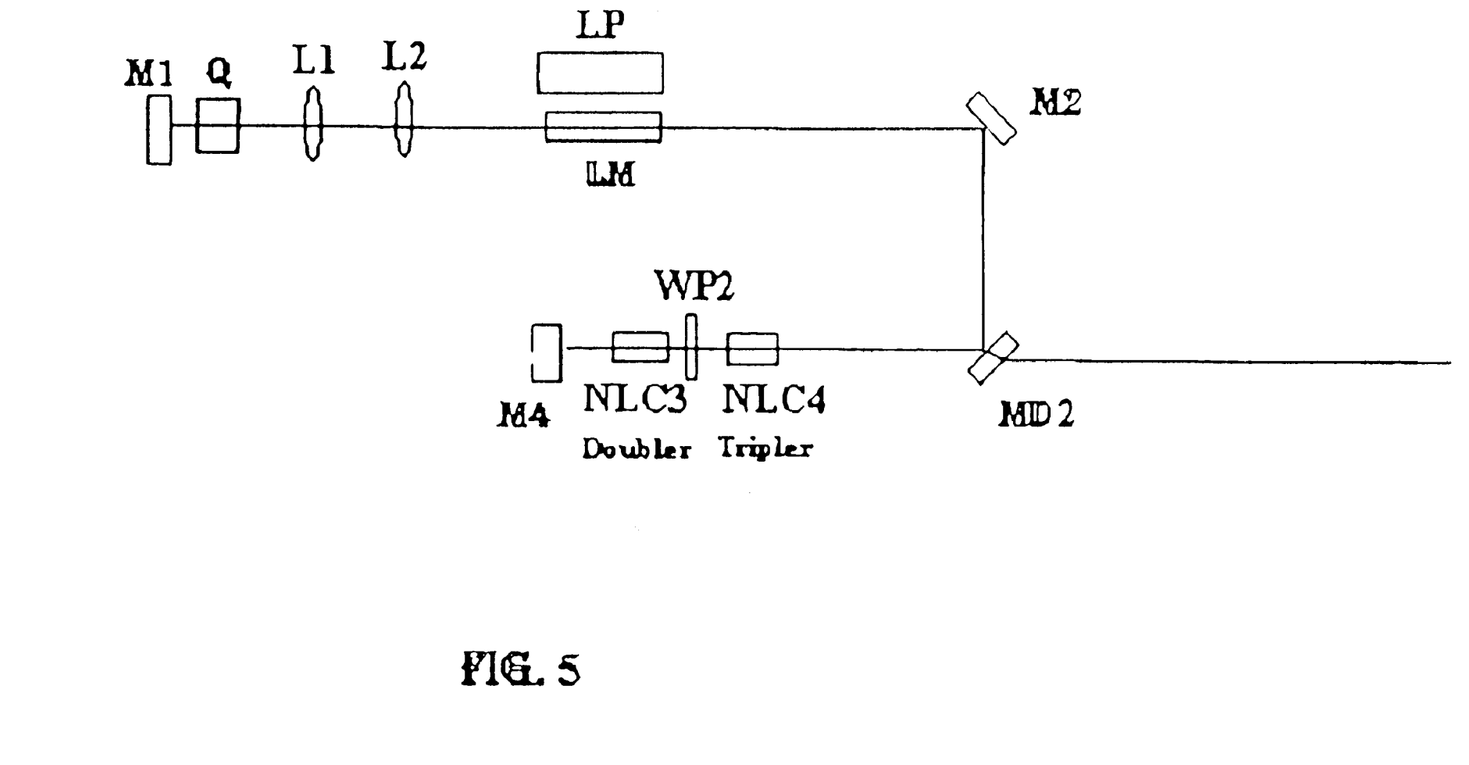
FIG. 5 is a diagrammatic view of an alternative embodiment of the laser according to the invention.

As best seen in FIG. 5, a further alternative embodiment is shorn. In FIG. 5 a horizontally polarized third harmonic beam is provided to MD2. A type I frequency tripling crystal NLC4 is provided in place of NLC2. A dual waveplate WP2 is provided between NLC1 and NLC2 for rotating fundamental beam full wave and second harmonic half wave.

In operation, the fundamental wave length beam having a vertical polarization is reflected by M2 to MD2 where it is reflected through NLC4 and WP2. The fundamental beam is unaffected on its pass through NLC4 which is a type I frequency tripling crystal for example Type I BBO or LBO crystal. The crystal has no effect on the fundamental beam unless the second harmonic beam is present in parallel polarization to the fundamental beam. The fundamental beam passes through WP2 where its polarization is unchanged. Then the beam incidents on a type I doubling crystal NLC3. NLC3 converts a portion of the fundamental beam to a horizontally polarized second harmonic beam. The fundamental and second harmonic are reflected from M4 back through NLC3 in which a portion of the fundamental is again converted to a horizontally polarized second harmonic beam. Upon passing through WP2 the polarization of second harmonic beam is rotated one half wave. The fundamental and second harmonic beam then have relative parallel polarization to one another which is needed for the type I tripling crystal for third harmonic conversion. A portion of the fundamental and a majority of the second harmonic are converted to a third harmonic beam and exit NLC4. The generated third harmonic will be horizontally polarized. The horizontally polarized third harmonic then incidences on mirror MD2 which is oriented in such a way that the horizontally polarized beam will incidence on MD2 at a P polarization to MD2. As a result the P polarized third harmonic will be substantially entirely transmitted through mirror MD2. Since MD2 is reflective to fundamental beam, the unconverted fundamental beam will be reflected as described with regard to FIG. 1.

The foregoing is considered as illustrative only to the principles of the invention. Further, since numerous changes and modification will occur to those skilled in the art, it is not desired to limit the invention to the exact construction and operation shown and described above, and accordingly, all suitable modifications and equivalents may be resorted to, falling within the scope of the invention.

We claim:

1. A frequency tripled laser comprising
   a) a first mirror and a second mirror spaced apart from said first mirror to form an optical resonator cavity therebetween;
   b) a laser medium located within said cavity for generating a fundamental beam of electromagnetic radiation (EMR) having a first preselected wave length from the front end and the back end of said laser medium;
   c) a second harmonic generator for converting a portion of said EMR of said first preselected fundamental wave length beam to a second harmonic beam in optical communication with said front end of said laser medium;
   d) said second harmonic generator including a second harmonic generation nonlinear crystal having a first EMR port for receiving and directing radiation through said crystal and a second EMR port for receiving and directing radiation through said crystal whereby radiation will enter said first EMR port, propagate through said crystal and exit said second EMR port and vice versa;
   e) means to direct said fundamental beam and said second harmonic beam from second EMR port to said second mirror to reflect said fundamental and said second harmonic beams to said second EMR port for propagation back through said second harmonic generating non-linear crystal;
   f) a third harmonic generator including a third harmonic generation nonlinear crystal having a third EMR port for receiving and directing radiation through said crystal and a fourth EMR port for receiving and directing radiation through said crystal whereby radiation will enter said third EMR port, propagate through said crystal and exit said fourth EMR port and vis versa whereby a portion of the fundamental and a portion of second harmonic beams are converted to a third harmonic beam;
   f) means to direct the EMR propagating from said first EMR port to said third harmonic generator;
   h) a third harmonic beam separator in optical communication with said fourth EMR port to separate said third harmonic beam from said fundamental beam;
   i) means to direct the separated third harmonic beam outside said optical resonator cavity;
   j) directing means to direct said fundamental beam from said third harmonic beam separator back through said laser medium;
   k) said first mirror in optical communication with EMR propagating from the back end of said laser medium to reflect EMR back through said laser medium; and
   l) a fundamental beam polarizer located between said laser medium and said second harmonic generator to polarize said fundamental beam.

2. A frequency tripled laser according to claim 1 comprising:
   said third harmonic beam separator including
   a beam separation mirror for reflecting the fundamental beam and transmitting the third harmonic beam incidents on said mirror at a P polarization;
   means to direct said fundamental beam and said third harmonic beam to said beam separation mirror;
   a third harmonic beam polarization control to adjust the polarization of the third harmonic beam so that it has P polarization when said third harmonic beam incidents on said coated mirror.

3. A frequency tripled laser comprising
   a) a first mirror and a second mirror forming an optical resonator cavity therebetween;
   b) a laser medium located within said cavity for generating a fundamental beam of electromagnetic radiation (EMR) having a first preselected wave length from the front end and the back end of said laser medium;
   c) second harmonic generator for converting a portion of said EMR of said first preselected fundamental wave length beam to a second harmonic beam in optical communication with said front end of said laser medium;
   d) said second harmonic generator including a second harmonic generation nonlinear crystal having a first EMR port for receiving and directing radiation through said crystal and a second EMR port for receiving and directing radiation through said crystal whereby radiation will enter said first EMR port, propagate through said crystal and exit said second EMR port and vis versa;
   e) means to direct said fundamental beam and said second harmonic beam from second EMR port to said second mirror to reflect said fundamental and said second harmonic beams to said second EMR port for propagation back through said second harmonic non-linear crystal;
   f) said third harmonic generator including a third harmonic generation nonlinear crystal having a third EMR port for receiving and directing radiation through said crystal and a fourth EMR port for receiving and directing radiation through said crystal whereby radiation will enter said third EMR port, propagate through said crystal and exit said fourth EMR port and vis versa whereby a portion of the fundamental and a portion of second harmonic beams are converted to a third harmonic beam;
   g) means to direct EMR propagating from said first EMR port to said third harmonic generator;
   h) a third harmonic beam separator mirror in optical communication with said fourth EMR port to reflect fundamental beam and transmit third harmonic beam incidents on said mirror at a P-Polarization to said mirror, outside said optical resonator cavity;
   i) means to direct EMR propagating from said third harmonic generator to said third harmonic beam separator;
   j) directing means to direct said fundamental beam back through said laser medium; and
   k) said first mirror in optical communication with EMR propagating from the back end of said laser medium to reflect said EMR back through said laser medium;

l) a fundamental beam polarizer located between said laser medium and said second harmonic generator to polarize said fundamental beam;

m) a third harmonic beam polarization control to adjust the polarization of the third harmonic beam so that it has P polarization when said third harmonic beam incidents on said coated mirror.

4. The frequency tripled laser according to claim 3 wherein said fundamental beam polarizer provides vertical polarization to said fundamental beam; said third harmonic beam polarization control includes a waveplate for rotating said fundamental beam a full wave or an integer of a full wave and rotating the third harmonic beam a half wave; said third harmonic beam separator mirror being oriented such that a horizontally polarized beam will incident on said mirror in P-polarization.

5. A frequency tripled laser according to claim 4 wherein said second harmonic generation non-linear crystal is a type I crystal and said third harmonic generation non-linear crystal is a type II crystal.

6. A frequency tripled laser according to claim 3 further comprising said fundamental beam polarizer is a vertical polarizer of said fundamental beam;

said second harmonic generation non-linear crystal is a type I crystal;

said third harmonic generation non-linear crystal is a type I crystal;

said third harmonic beam polarization control includes a waveplate located intermediate said second harmonic generation non-linear crystal and said third harmonic generation non-linear crystal; said waveplate rotating fundamental beam a full wave length or an integer of a full wave length; said waveplate rotating said second harmonic beam one half a wave length so that said fundamental beam and said second harmonic beam incident on said third harmonic non-linear crystal in parallel polarization to form a third harmonic beam having a horizontal polarization.

7. The frequency tripled laser according to claim 3 wherein the laser medium is a Nd:YlF laser crystal.

8. The frequency tripled laser according to claim 3 wherein the laser medium is a Nd:YAG.

9. The frequency tripled laser according to claim 3 wherein the third harmonic non-linear crystal is a type I crystal.

10. The frequency tripled laser according to claim 9 wherein the third harmonic non-linear crystal is a BBO or an LBO crystal.

11. The frequency tripled laser according to claim 3 wherein the third harmonic non-linear crystal is a type II crystal.

12. A method of providing a frequency tripled laser output a) forming an optical resonator cavity between a first mirror and a second mirror;

b) exciting a laser medium located within said cavity for generating a fundamental beam of electromagnetic radiation (EMR) having a first preselected wave length from the front end and the back end of said laser medium; polarizing said fundamental beam;

c) passing said polarized fundamental wave length beam across a second harmonic generating non-linear crystal located within said optical resonator cavity to convert a portion of said EMR of said first preselected fundamental wave length beam to a second harmonic beam;

d) reflecting said fundamental and said second harmonic beams back through said second harmonic generating non-linear crystal to convert an additional part of said fundamental beam to second harmonic;

e) directing the fundamental and second harmonic beams across a third harmonic generating crystal located within said optical resonator cavity; whereby a portion of the fundamental and a portion of second harmonic beams are converted to a third harmonic beam;

f) separating the third harmonic beam from said fundamental beam;

g) directing the separated third harmonic beam outside said optical resonator cavity.

* * * * *